United States Patent [19]

Ogura et al.

[11] 4,366,613

[45] Jan. 4, 1983

[54] METHOD OF FABRICATING AN MOS DYNAMIC RAM WITH LIGHTLY DOPED DRAIN

[75] Inventors: Seiki Ogura, Hopewell Junction; Paul J. Tsang, Poughkeepsie, both of N.Y.

[73] Assignee: IBM Corporation, Armonk, N.Y.

[21] Appl. No.: 217,497

[22] Filed: Dec. 17, 1980

[51] Int. Cl.³ .......................................... H01L 21/26
[52] U.S. Cl. ..................... 29/571; 29/576 B; 29/577 C; 148/187
[58] Field of Search ................. 29/571, 576 B, 577 C; 148/1.5, 187, 188; 357/23 VT

[56] References Cited

U.S. PATENT DOCUMENTS

| | | | |
|---|---|---|---|
| 3,996,657 | 12/1976 | Simko et al. | 29/571 |
| 3,997,367 | 12/1976 | Yau | 148/1.5 |
| 4,038,107 | 4/1977 | Marr et al. | 148/1.5 |
| 4,160,683 | 7/1979 | Roche | 148/187 |
| 4,182,636 | 1/1980 | Dennard et al. | 29/571 X |
| 4,198,250 | 4/1980 | Jecmen | 148/1.5 |
| 4,209,349 | 6/1980 | Ho et al. | 148/187 |
| 4,209,350 | 6/1980 | Ho et al. | 148/187 |
| 4,280,271 | 7/1981 | Lou et al. | 29/571 |
| 4,282,646 | 8/1981 | Fortino et al. | 29/571 |
| 4,282,648 | 8/1981 | Yu et al. | 29/571 |
| 4,287,661 | 9/1981 | Stoffel | 204/192 E |
| 4,290,186 | 9/1981 | Klein et al. | 29/576 B |

FOREIGN PATENT DOCUMENTS 2636350 12/1977 Fed. Rep. of Germany .......... 29/76

OTHER PUBLICATIONS

Bassous, E. et al; "Self-Aligned Polysilicon Gate Mosfets with Tailored Source and Drain Profiles", IBM Technical Disclosure Bulletin, vol. 22, No. 11, Apr. 1980, pp. 5146-5147.

*Primary Examiner*—G. Ozaki
*Attorney, Agent, or Firm*—Pollock, Vande Sande & Priddy

[57] ABSTRACT

A method of manufacturing LDD MOS FET RAM capable of delineating short (less than 1 micrometer) lightly doped drain regions. An N⁻ implant is effected between gate electrodes and field oxide insulators, before the N+ implant. An insulator layer is then deposited also prior to N+ ion implantation. Reactive ion etching of the layer leaves narrow dimensioned insulator regions adjacent the gate electrode which serves to protect portions of the N⁻ impurity region during the subsequent N+ implant. These protected regions are the lightly doped source/drain regions.

13 Claims, 15 Drawing Figures

METHOD OF FABRICATING AN MOS DYNAMIC RAM WITH LIGHTLY DOPED DRAIN

FIELD OF THE INVENTION

The invention relates to methods for forming highly dense, very small integrated circuits semi-conductor devices and more particularly for forming a high-speed, high density MOS dynamic RAM with lightly doped drain structures.

BACKGROUND OF THE INVENTION

Present day semi-conductors in commercial use are almost exclusively manufactured with optical lithography techniques for pattern transfer. To satisfy the demand for ever increasing density and corresponding reduction of line width, two general approaches are available; using non-light lithography, or the innovation of new manufacturing techniques for increasing the density of integrated circuitry with the use of optical lithography techniques.

Much effort has gone into the former approach, see for example "High Speed MOS FET Circuits Using Advanced Lithography" in *Computer*, Volume 9, No. 2, February 1976, pages 31-37, which describes the substantial equipment cost and complexities of X-ray and electron beam lithography.

Present day optical techniques are considered suitable for commercial production of devices having dimensions of at least one micrometer, and it is an object of the invention to provide a technique for the fabrication of a high speed dynamic RAM in which it is important to achieve delineation substantially less than one micrometer, and wherein this is achieved using optical lithography.

A relatively recent addition to the arsenal of tools available in the manufacture of integrated circuitry is plasma or reactive ion etching (sometimes referred to herein as RIE). This is a technique which has been developed for etching metals, semi-conductor materials and dielectrics in the manufacture of integrated circuit devices. The process involves the use of a plasma or ionized gas containing a variety of highly reactive particles such as ions, free electrons and free radicals. The plasma used in etching may be maintained in relatively low temperatures on the order of 250° C. at low pressures, in the range of 0.005 to 20 torr. See in this regard "A Survey of Plasma Etching Processes" by Bersin in *Solid State Technology*, May 1976, pages 31-36, Hochberg U.S. Pat. No. 3,966,577; Bondur U.S. Pat. Nos. 4,104,086 and 4,139,442. Further information concerning reactive ion etching can be found in the Harvilchuck patent application Ser. No. 960,322 filed Nov. 13, 1978, assigned to the assignee of this application. An example of the use of reactive ion etching in another semi-conductor device is found in Ho U.S. Pat. No. 4,209,349; assigned to the assignee of this application.

A particularly effective MOS FET configuration allowing densities higher than that heretofore available in such devices is described in "A New Short Channel MOS FET with Lightly Doped Drain" by Saito et al in Denshi Tsushin Rengo Taikai (Japanese) April 1978, page 2-20. The LDD N MOS FET includes, in addition to the channel separating implanted N+ source and drain regions, diffused N− regions, which increases the channel breakdown voltage or snap-back voltage and reduces device drain junction electron impact ionization (and thus, hot electron emission) by spreading the high electric field at the drain pinch-off region into the N− region. This allows either an increase in power supply voltage or reduction in channel length at a given voltage to achieve performance enhancement. Insofar as applicants are informed, the known techniques for fabricating such a device generally include using planar silicon gate processing techniques and optical lithography in which first, a gate stack is patterned, and the N+ source/drain regions are implanted. Following this, an etch is used to undercut the polysilicon gate, and the N− region is implanted in the undercut region. Controlling the extent of undercut is difficult because of the small tolerance required on the length of the N− region. It is another object of the present invention, therefore, to provide a method of fabricating an LDD MOSFET which provides for readily achievable control on the length of the N− regions especially where those regions are substantially less than 1 micrometer long.

Other features, objects and advantages of the invention will be apparent as this description proceeds.

SUMMARY OF THE INVENTION

In accordance with the invention the foregoing and other difficulties in the prior art are obviated, and the controllability and repeatability of the process for manufacturing a high speed field effect transistor dynamic RAM is increased. In accordance with one aspect of the invention, a high speed field effect transistor dynamic RAM is formed with lightly doped drain by:
  providing a monocrystalline silicon body with spaced dielectric insulator regions extending above a surface of the body,
  forming polysilicon gate electrodes between adjacent dielectric insulator regions with substantially vertical surfaces,
  ion implanting N+ type impurity between adjacent gate electrodes and dielectric insulator regions; the improved process provides for lightly doped drain regions by, prior to the previously recited ion implantation, first:
  ion implanting N type impurity to form N impurity type regions between the vertical surfaces of the gate electrode and said insulator regions, thereafter
  forming an insulator layer (which will be subsequently partially removed by reactive ion etching) with resulting substantially vertical surfaces adjacent the substantially horizontal surface formed by forming said insulator layer atop horizontal surfaces of said monocrystalline silicon body, and thereafter
  reactive ion etching said last formed insulator layer to remove all of said substantially horizontally disposed insulator layer to leave narrow dimensioned insulator regions or sidewall spacers adjacent to said substantially vertical surfaces, to thereby protect underlying regions of N− type impurity from said subsequent N+ type impurity ion implantation.

An important advantage of this aspect of the invention is that it allows ready fabrication of a so-called Hi C (for high capacitance) storage cell, which has a high capacitance storage node and is self-aligned. This is implemented by implanting a P-type impurity, e.g., boron, between a selected gate electrode and an adjacent insulator region, subsequent to the reactive ion etching but prior to the formation of the capacitor plate and the N+ implant.

The lightly doped drain (LDD) regions of the device allows the high electric field at the drain pinch-off region to be spread resulting in an increase in the device channel breakdown voltage or snap-back voltage and a reduction in hot electron emission. Accordingly, either an increase in power supply voltage or a reduction in channel length at a given voltage enhances performance.

The Hi C charge storage node (or capacitor) formed by a self-aligned ion implant and protected by the lightly doped drain regions, enjoys high punch through voltage and has an enhanced charge storage capability. It is therefore, less susceptible to α-particle problems.

The oxide sidewall spacer functions, in addition to defining the LDD regions, also to protect device polysilicon gate from oxidation, preventing the formation of a reversed "bird's beak" that would normally form along two sides of the polysilicon gate during source/drain oxidation.

In a first specific embodiment of the invention the referred to insulator regions, initially provided on the monocrystalline silicon body can be recessed oxide insulators, or in a second embodiment of the invention, said insulator regions can be laid down above the surface of the monocrystalline silicon body.

In connection with embodiments of the invention in which the first insulator layer is not recessed, employing the invention can reduce or eliminate the so-called bird's beak in the field oxide and allow the possibility of forming borderless contacts to the device source/drains. Both these characteristics improve the device packing density. In this form of the invention field isolation comprises an $SiO_2$-$Al_2O_3$-$SiO_2$ (OAO) insulator. In accordance with this aspect of the invention a monocrystalline silicon body is first subjected to a blanket shallow P-type ion implantation, followed by growth of a thin oxide layer, followed by deposition of $Al_2O_3$ layer, followed finally by chemical vapor deposition of a further, relatively thick oxide layer. Using a conventional resist mask, device windows with substantially vertical sidewalls are obtained by anisotropic reactive ion etching (RIE). During this process the layer of aluminum oxide serves as the silicon dioxide etch stopper. Following the reactive ion etching, the aluminum oxide and underlying silicon dioxide are dip etched, the wafer is cleaned and gate oxide is grown. Then the polysilicon gate is formed. At this point the $N^-$ impurity region is implanted between insulator regions and adjacent gate electrodes. Subsequently, an insulator layer (which will later be reactive ion etched) is laid down and reactive ion etched so as to leave narrow dimensioned substantially vertical insulator regions or sidewall spacers to protect portions of the previously implanted $N^-$ impurity regions. At this point, implantation of boron impurity for the HiC capacitor plate, followed by the $N^+$ type impurity implant for the source/drain regions and capacitor is effected. At this point, the deposition and delineation of the second polysilicon (plate forming) region is effected. Plate self-passivating oxide is grown following which self-forming borderless contacts to the source/drain regions can be obtained by etching (either wet or reactive ion etching). Once the source/drain contact holes are available, they can be metallized, followed by etching contact holes to the polysilicon regions and metallization thereof. In addition to the advantages achieved by recessed oxide insulation the use of field OAO insulation further enhances electrical isolation between neighboring devices.

As an alternative, the OAO field isolation can be replaced by silicon dioxide, grown thermally or chemical vapor deposited. Use of the OAO field isolation, is preferred since it inherently provides for an etch stopper giving good repeatability.

In addition, in either embodiment polysilicon may be deposited instead of the chemical vapor deposited silicon dioxide in respect of the insulator layer which is reactive ion etched (RIE) to leave the narrow dimensioned substantially vertical upstanding insulator or sidewall spacer. When using polysilicon, a low temperature (for example 800° C.) steam oxidation is effected before the HiC ion implant and the source/drain $N^+$ ion implant to convert the polysilicon spacer into silicon dioxide. As is known to those skilled in the art, an advantage of using polysilicon over silicon dioxide is that the end point in the reactive ion etching can be easily detected.

BRIEF DESCRIPTION OF THE DRAWINGS

The invention will now be described in the following portions of the specification so that those skilled in the art will be able to practice the same, when taken in connection with the attached drawings in which like reference characters identify identical apparatus and in which.

DISCLOSURE OF THE INVENTION

Figure 1:
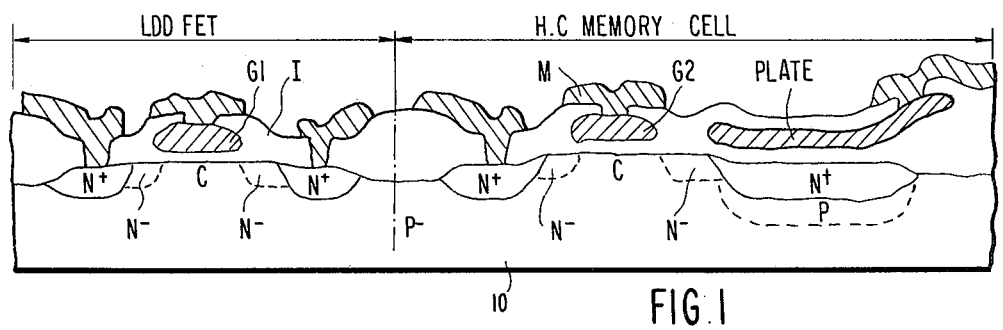
FIG. 1 is a cross-section of a portion of a wafer manufactured in accordance with the present invention.

FIG. 1 is a cross section of a high speed field effect transistor dynamic RAM integrated circuit structure which can be formed in accordance with the present invention, and which is typically repeated many times on a single substrate. FIG. 1 shows the LDDFET of the RAM's peripheral circuit on the left and the one device memory cell of the RAM, on the right. For illustrative purposes FIG. 1, and the remaining portion of the specification, refer to a N-channel MOSFET RAM. It should be understood, however, that the invention is not restricted to N-channel devices but is also applicable to P-channel devices. In case of a P-channel device the dopant type and electrode polarity are reversed, as is understood by those skilled in the art. As shown in FIG. 1 a P-type semi-conductor substrate, for example, monocrystalline silicon has gate electrodes G1 and G2 which are supported above the monocrystalline silicon by an insulating layer I. Holes in the insulating layer I allow metallization areas M to make electrical contact to the gates G1 and G2. A capacitor plate is also supported in the insulating layer I, and metallization contacts M also make electrical contact with the plate. Located vertically (in the case where the semi-conductor body is oriented horizontally as shown in FIG. 1) below the plate are overlying P and $N^+$ ion implanted regions forming a so-called HiC charge storage capacitor. In addition, and located adjacent the gates G1 and G2 are ion implanted $N^+$ impurity source and drain regions. Each of the source/drain regions has lightly doped drain regions formed of ion implanted $N^-$ type impurities separating the source/drain regions from the channel, i.e., that portion of the substrate lying laterally between respective source/drain regions, and designated c in FIG. 1. The present invention is arranged to provide a high speed field effect transistor dynamic RAM integrated circuit as shown in FIG. 1 in which the channel length can be as small as 0.5 micrometers, the insulating film below the gates of 25 to 100 nanometers with the length of the lightly doped drain regions $N^-$ (extending from the $N^-$-$N^+$ interface to the $N^-$ channel interface) being on the order of 0.25 to 0.7 micrometers. The lightly doped drain allows operation at 8.5 volts even with the short (e.g., 1.2 micrometer) channel length.

Figure 2A:
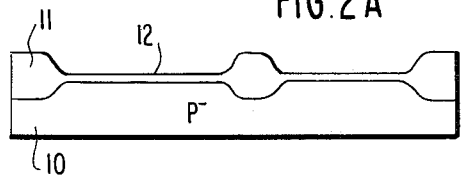
FIGS. 2A-2G are cross-sections of the wafer in the various stages of its formation used to illustrate the various steps of one embodiment of the invention.

In accordance with the invention fabrication of the device shown in FIG. 1 begins, for example, with a P-type monocrystalline silicon body 10 which has had formed on its surface field and gate oxides 11 and 12 as shown in FIG. 2A. The field oxides can be comprised of a variety of materials or combinations of materials which include silicon dioxide, silicon nitride, aluminum oxide and the like, and the gate silicon dioxide 12 can be formed by any of a variety of conventional methods. FIG. 2A illustrates the field oxides as including recessed oxide insulators 11, but as will be discussed hereinafter, the use of recessed insulators is not essential to the invention.

Figure 2B:
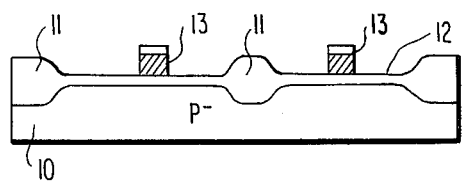

In accordance with the invention gate electrodes (e.g., polysilicon) are formed at selected locations, i.e., between adjacent oxide insulators 11, and those polysilicon gate electrodes 13 are formed to have vertical or substantially vertical side walls by, for example, directional reactive ion etching (RIE), so that the resulting product appears as is shown in FIG. 2B.

Figure 2C:
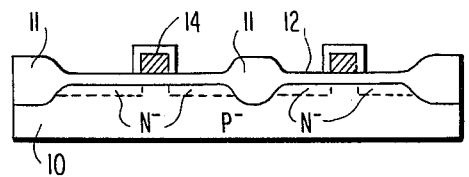

This structure is now subjected to $N^-$ impurity type ion implantation in the region between insulator 11 and gate 13 using for example As, and portions of this ion implanted region will form the lightly doped drains, as will be disclosed hereinafter. Following ion implantation, annealing is effected so as to drive in the implanted ions and simultaneously, by reason of a low temperature (for example 800° C.) steam oxidation, silicon dioxide layer 14 is formed around the polysilicon gate electrodes. At this point, the product takes the form shown in FIG. 2C, where the ion implanted regions are identified as $N^-$.

Figure 2D:
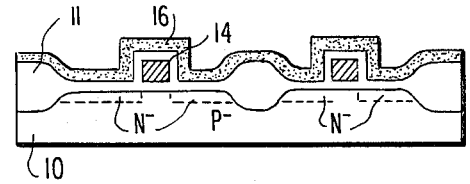

Chemical vapor deposited (CVD) silicon dioxide, using a low pressure technique, is deposited which in effect provides for a second insulator layer 16 on both the substantially horizontal and substantially vertical surfaces of the silicon body and gate electrodes. The resulting product is shown in FIG. 2D.

Figure 2E:
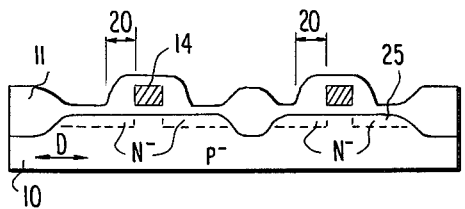

At this point, directional reactive ion etching (RIE) is effected of the second insulator layer 16 to substantially remove the second insulator layer from the substantially horizontal surfaces. While the reactive ion etching also removes portions of the vertically oriented second insulator layer, because of the directionality of the reactive ion etching, the result of that process is to leave narrow dimensioned second insulator regions or sidewall spacers 20 adjacent the substantially vertical surfaces of the gate electrodes. The lateral dimension of these regions, i.e., in the direction of the arrow D, is significant because this length will determine the length of the lightly doped drain regions (identified as $N^-$ in FIG. 1). The reactive ion etching can proceed until substantially all of the horizontally disposed chemical vapor deposited silicon dioxide 16 has been removed, but the reactive ion etching step can be followed by a buffered HF dip to remove the remaining silicon dioxide in the source/drain regions, i.e., overlying the $N^-$ regions identified in FIG. 2E. While this buffered HF dip will also remove some of the narrow dimensioned second insulator regions 20, because of the anisotropic nature of the reactive ion etching, the narrow dimensioned vertically oriented second insulating regions 20 will have sufficient lateral dimension remaining after the dip, whereas that dip can remove essentially all the silicon dioxide overlying the source/drain regions. Using conventional techniques thereafter, the entire wafer is cleaned and then the capacitor plate oxide is grown on the area 25, of FIG. 2E.

Once the capacitor plate oxide is formed, a blocking resist mask is applied which is used to isolate the capacitor plate region, and with this mask, the P-type impurity is implanted. The blocking resist mask is then removed and $N^+$ type impurity, e.g., As is ion implanted and subsequently annealed. Because of the presence of the narrow dimensioned second insulator regions or sidewall spacers adjacent the substantially vertical surface of the gate electrodes, the $N^+$ ion implantation will take effect only in a portion of the region which had previously been subjected to the $N^-$ implantation and accordingly, at the conclusion of the annealing step, following ion implantation, the device takes on the form shown in FIG. 2F. At this point it should be apparent that the source and drain regions are implanted, and those regions are separated from the channel c by the lightly doped drain regions ($N^-$).

Completion of the device then can take conventional forms, i.e., deposition and delineation of a second polysilicon region to form a capacitor plate 30; source/drain dopant drive-in and reoxidation and deposition of silicon dioxide for device passivation. Following these steps, the device takes on the form shown in FIG. 2G.

Figure 2F:
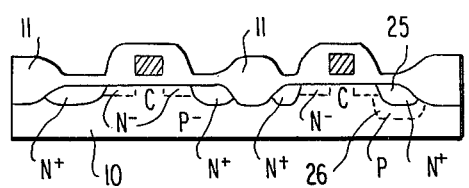
Figure 2G:
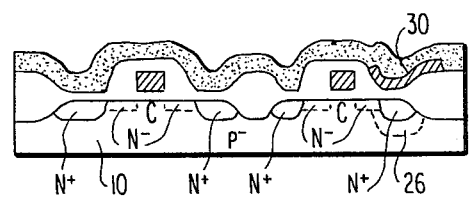

It is only necessary then to etch the contact holes and provide metallization so that the device of FIG. 2G will take on the form as shown in FIG. 1.

As mentioned above, in a first variant on the method described immediately above, the RIE layer 16 (FIG. 2D) which, in the immediately above described embodiment was CVD-SiO₂, can instead comprise a polysilicon layer 16'. In this embodiment of the invention the subsequent steps are identical to that described above except that, prior to the boron ion implantation (FIG. 2F) a low temperature steam oxidation (e.g., 800° C.) is effected to convert the polysilicon RIE layer 16' to silicon oxide. One advantage of using this embodiment of the invention is that the reactive ion etching of the RIE layer has an easily detected end point, i.e., polysilicon layer 16' is deposited atop the silicon dioxide layer 12.

In a further embodiment of the invention, the field oxide 11 is not a recessed oxide.

Figure 3D:
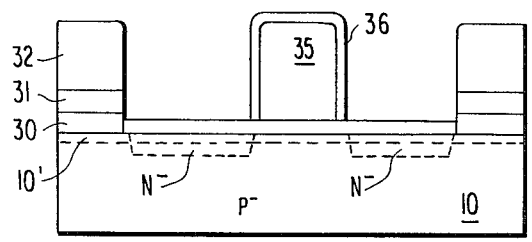
FIGS. 3A-3G are similar cross-sections related to another embodiment of the invention.
Figure 3A:
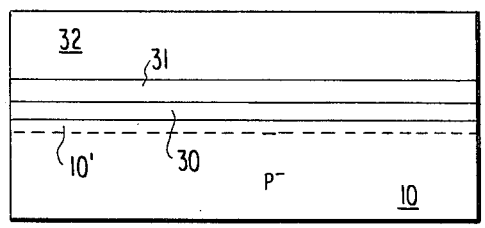

As shown in FIG. 3A a suitable silicon substrate 10 which may have a P-type impurity doping is first subjected to a blanket shallow boron ion implantation (shown at 10') following which a thin silicon dioxide layer 30 is grown, upon which is deposited a thin aluminum oxide layer 31, which is itself covered by CVD silicon dioxide 32 forming a so-called OAO insulator.

Figure 3E:
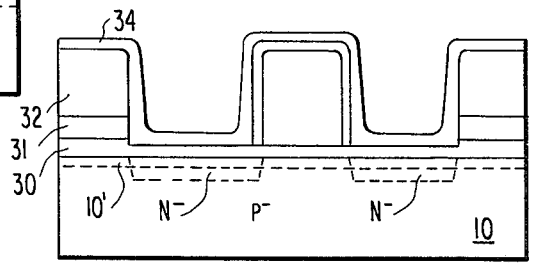
Figure 3B:
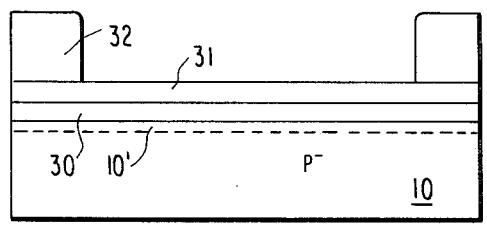

Using a resist mask, and conventional optical lithography techniques, windows are opened in the silicon dioxide uppermost layer are effected. Preferably, this employs reactive ion etching so that the sidewalls of the insulator 32 are vertical or substantially vertical, the aluminum oxide serves as an etch stop for the silicon dioxide etch. FIG. 3B shows a typical window at the conclusion of this step.

Subsequently, the aluminum oxide and underlying silicon dioxide layers 31 and 30 are etched off in the window, the wafer is cleaned and a gate oxide layer 33 is grown. The resulting typical window is shown at this step, in FIG. 3C.

Subsequently, a polysilicon gate with essentially vertical sidewalls 35 is provided, again preferably using reactive ion etching. The polysilicon gate now partially fills the previously opened window and forms windows between itself and the adjacent dielectric insulators 32. Ion implantation of N− impurities is now effected in these newly formed windows using again, preferably As. After annealing and growth of a gate polysilicon sidewall oxide 36 to a desired thickness (by for example, a low temperature steam oxidation) the resulting structure is shown in FIG. 3D.

Figure 3F:
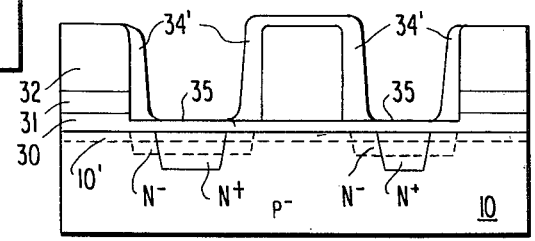
Figure 3C:
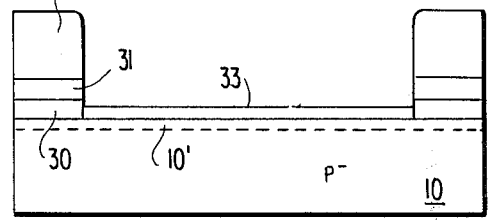

Now a CVD SiO$_2$ layer 34 is laid down. The resulting product is now shown in FIG. 3E. This product is then reactive ion etched, as in previous embodiments of the invention so as to leave the narrow dimensioned insulator regions or sidewall spacers 34' adjacent the substantially vertical surfaces of the gate electrodes and adjacent insulators, as shown in FIG. 3F. At this time, ion implantation of a N+ impurity is effected to form device source and drain. The product now takes the form shown in FIG. 3F. At this time, the plate oxide is grown and the polysilicon plate is formed. As in the first disclosed embodiment a HiC capacitor may be formed prior to the formation of the polysilicon plate by implanting a P-type impurity in the charge storage capacitor region.

The formation of the capacitor plate takes the form shown in FIGS. 2F and 2G, and is not repeated in FIG. 3 since FIGS. 3A–3F, illustrate typical source and drain regions. At this point, all or selected source and drain regions are etched, using wet etching or reactive ion etching technique to remove the oxide 35 overlying these regions. It should be noted at this point, that due to the protection of the sidewall spacer no masking is required for this step and, following this step, the resulting product is shown in FIG. 3G. Note that the openings thus formed over the source and drain regions are self-forming, borderless and provide holes for the deposition of metallization to provide source and drain contacts.

Figure 3G:
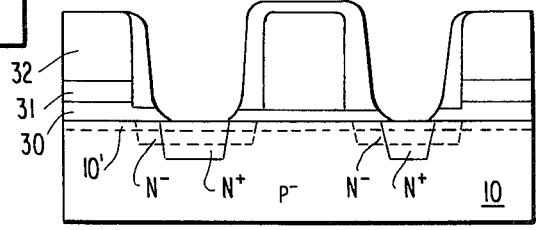

Completion of the device from the stage shown in FIG. 3G, including metallization and passivation take entirely conventional forms and are therefore, not further illustrated.

Those skilled in the art will be aware that rather than using the SiO$_2$ spacer illustrated in FIGS. 3A–3G, that sidewall spacer can be polysilicon which is later converted to SiO$_2$ by a low temperature steam process, much as in the case of FIGS. 2A–2G. Furthermore, many other changes will become apparent to those skilled in the art, the embodiments disclosed herein are illustrative rather than limiting. The scope of the invention is defined by the following claims.

What is claimed is:

1. A method of forming a high speed field effect transistor dynamic RAM integrated circuit structure with lightly doped drain areas, comprising the steps of:
   providing a monocrystalline silicon body with a gate oxide and with spaced dielectric insulator regions extending above a surface of said body,
   forming polysilicon gate electrodes between adjacent dielectric insulator regions with substantially vertical surfaces,
   ion implanting N+ type impurity between adjacent gate electrodes and dielectric insulator regions,
   wherein the improvement comprises, prior to said ion implanting step,
   ion implanting N− type impurity to form N− impurity type regions between said vertical surface of said gate electrode and said insulator regions,
   forming a spacer insulator layer with resulting substantially vertical surfaces adjacent said substantially vertical surfaces of said gate electrode and substantially horizontal surfaces overlying said monocrystalline body, and
   reactive ion etching said spacer insulator layer to remove substantially all of said substantially horizontally disposed spacer insulator layer to leave narrow dimensioned spacer insulator regions adjacent said substantially vertical surfaces of said gate electrodes, to thereby protect underlying regions of N− type impurity from said succeeding N+ type impurity ion implantation.

2. The method of claim 1 wherein said step of providing a monocrystalline silicon body with spaced dielectric insulator regions, provides recessed insulator regions.

3. The method of claims 1 or 2 which includes the further steps, subsequent to said reactive ion etching of said spacer insulator layer, of:
   blocking all of said body but selected regions between a selected gate electrode and insulator region and ion implanting a P-type impurity, thereafter removing said mask and
   effecting said step of ion implanting said N+ impurity between each insulator region and gate electrode.

4. The method of claim 1 wherein said step of providing said monocrystalline silicon body with spaced dielectric insulator regions, provides insulator regions deposited on said monocrystalline silicon body.

5. The method of claims 1 or 4 in which said step of providing a monocrystalline silicon body comprises:
   (i) growing a thin oxide layer (O), subsequently,
   (ii) depositing a Al$_2$O$_3$ layer (A), subsequently
   (iii) depositing a silicon dioxide layer (O)), and
   (iv) etching windows in said OAO composite to leave spaced insulator regions each overlying an Al$_2$O$_3$ layer.

6. The method of claim 5 in which said step of forming said polysilicon gate electrodes includes growing an oxide layer over said silicon body between said spaced insulator regions, and which includes the further step, subsequent to said ion implanting of said N+ impurity of
   (1) dip etching said gate oxide overlying said implanted N+ impurity region to form holes in said gate oxide and
   (2) metalizing in the thus formed holes to form self-forming borderless contacts to source and drain regions found by said N+ ion implantation.

7. The method of claim 1 in which said N− regions have a dimension substantially less than 1 micrometer.

8. The method of claim 1 in which said N− regions have a dimension in the range 0.25 to 0.7 micrometers.

9. A method of forming a high speed field effect transistor dynamic RAM integrated circuit structure comprising the sequential steps of:
   (a) providing a silicon body having monocrystalline silicon regions isolated from other monocrystalline silicon regions by dielectric insulator regions,
   (b) forming on said body a first insulator layer with ultimate gate dielectric thickness, (c) forming polysilicon gate electrodes at selected locations on said first insulator layer with substantially horizontal and substantially vertical surfaces, (d) ion implanting a N− impurity through said first insulator layer to form N− regions in said silicon body, (e) annealing said body to drive in the N− impurity into said body and to form a silicon dioxide insulator layer on said polysilicon gate electrode, (f) depositing a second insulator layer on both said substantially horizontal and vertical surfaces, (g) reactive ion etching said second insulator layer to substantially remove said second insulator layer from said substantially horizontal surfaces and to provide narrow dimensioned second insulator regions adjacent said substantially vertical surfaces, (h) ion implanting a N+ impurity through the substantially horizontal surface, which has been reduced in dimension by said narrow dimensioned second insulator regions, to form N+ source and drain regions which are deeper and narrower than said N− regions, (i) depositing and delineating the polysilicon capacitor plates of said dynamic RAM, (j) forming contacts to said sources and drains, and (k) making contact to said capacitor plates and said gate electrodes.

10. The method of claim 9 which includes the further steps, prior to said step (h) of:

(i) applying a resist mask over said silicon body except between selected regions defined between a selected gate electrode and a selected dielectric insulator region, (ii) ion implanting a P-type impurity to initiate a capacitor region, and (iii) removing said resist mask.

11. The method of claim 9 wherein said step (j) comprises the steps of:

(i) etching all portions of the first insulator layer between said gate electrodes and some of said insulator regions to expose N+ type impurity regions, and (ii) depositing a metallization layer in contact with said N+ type impurity region and extending vertically upward along substantially vertical surfaces of said second insulator regions.

12. The method of claim 9 in which said step (a) includes the sequential steps of:

i. forming a dioxide layer on a surface of said body, ii. depositing an aluminum oxide layer thereon, iii. depositing a second dioxide layer thereon, iv. selectively removing regions of said second dioxide layer to open windows in said second dioxide layer, exposing said aluminum oxide layer in said regions, v. etching said aluminum oxide layer and said first dioxide layer in said regions, to thereby leave regions of said body isolated from said other regions by said remaining second dioxide layer.

13. The method of claim 12 wherein said step iv is a reactive ion etching step and wherein said aluminum oxide is $Al_2O_3$.

* * * * *